(12) United States Patent
Lv et al.

(10) Patent No.: US 10,193,495 B2
(45) Date of Patent: Jan. 29, 2019

(54) PHOTOVOLTAIC JUNCTION BOX AND DIODE

(71) Applicant: Tyco Electronics (Shanghai) Co. Ltd., Shanghai (CN)

(72) Inventors: Wenbo Lv, Shanghai (CN); Cui Li, Shanghai (CN); Xiang Xu, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/371,582

(22) Filed: Dec. 7, 2016

(65) Prior Publication Data

US 2017/0163211 A1 Jun. 8, 2017

(30) Foreign Application Priority Data

Dec. 8, 2015 (CN) .................... 2015 2 1011422 U

(51) Int. Cl.
*H02S 40/34* (2014.01)
*H01L 23/31* (2006.01)
*H01L 23/367* (2006.01)
*H01L 23/482* (2006.01)
*H01L 23/492* (2006.01)
*H02G 3/08* (2006.01)

(52) U.S. Cl.
CPC .......... *H02S 40/34* (2014.12); *H01L 23/3107* (2013.01); *H01L 23/367* (2013.01); *H01L 23/4822* (2013.01); *H01L 23/492* (2013.01); *H02G 3/08* (2013.01)

(58) Field of Classification Search
CPC ...................................................... H02S 40/34
See application file for complete search history.

(56) References Cited

U.S. PATENT DOCUMENTS

| | | | | |
|---|---|---|---|---|
| 6,307,272 | B1 * | 10/2001 | Takahashi | H01L 23/49562 257/666 |
| 6,344,612 | B1 * | 2/2002 | Kuwahara | H01L 31/048 174/50 |
| 6,655,987 | B2 * | 12/2003 | Higashikozono | H01R 9/2425 439/535 |
| 8,237,065 | B2 * | 8/2012 | Ishida | H01L 23/49562 174/252 |
| 8,388,358 | B2 * | 3/2013 | Thompson | H01R 13/11 439/76.1 |
| 2005/0224110 | A1 * | 10/2005 | Yoshikawa | H01L 31/02008 136/251 |
| 2005/0268958 | A1 * | 12/2005 | Aoyama | H01L 25/072 136/244 |
| 2005/0287843 | A1 * | 12/2005 | Tsukamoto | H01R 4/16 439/76.2 |
| 2009/0084570 | A1 * | 4/2009 | Gherardini | H02S 40/34 174/51 |

(Continued)

*Primary Examiner* — Hung V Ngo
(74) *Attorney, Agent, or Firm* — Barley Snyder

(57) ABSTRACT

A photovoltaic junction box is disclosed. The photovoltaic junction box has a housing, a plurality of contacts disposed in the housing, and a diode mounted on two adjacent contacts. Each diode has a pair of first pins separated from each other. Each first pin has a soldering end portion soldered on a first contact of the two adjacent contacts. A connection piece connects the soldering end portions of the pair of first pins and is soldered on the first contact.

18 Claims, 3 Drawing Sheets

(56) References Cited

U.S. PATENT DOCUMENTS

| | | | | |
|---|---|---|---|---|
| 2010/0218797 A1* | 9/2010 | Coyle, Jr. | H05K 7/026 | 136/243 |
| 2012/0052719 A1* | 3/2012 | Xue | H02S 40/34 | 439/485 |
| 2012/0060919 A1* | 3/2012 | Mills | H01R 13/6641 | 136/259 |
| 2012/0174970 A1* | 7/2012 | Yoshikawa | H02S 40/34 | 136/252 |
| 2012/0192940 A1* | 8/2012 | Schulz | H02G 3/16 | 136/256 |
| 2012/0205149 A1* | 8/2012 | Lenel | H02S 40/34 | 174/547 |
| 2012/0211062 A1* | 8/2012 | Yamazaki | H02S 40/34 | 136/252 |
| 2012/0224339 A1* | 9/2012 | Yoshikawa | H02S 40/34 | 361/752 |
| 2012/0314356 A1* | 12/2012 | Yoshikawa | H02S 40/34 | 361/679.01 |
| 2013/0003307 A1* | 1/2013 | Jang | H02S 40/34 | 361/709 |
| 2013/0014970 A1* | 1/2013 | Ger | H02G 3/16 | 174/59 |
| 2013/0016474 A1* | 1/2013 | Ger | H02S 40/345 | 361/707 |
| 2013/0029542 A1* | 1/2013 | Kraemer | H01R 4/4809 | 439/843 |
| 2013/0050956 A1* | 2/2013 | Wang | H01R 13/502 | 361/728 |
| 2013/0146118 A1* | 6/2013 | Kelley | H05K 5/02 | 136/244 |
| 2013/0193568 A1* | 8/2013 | Yamazaki | H01L 23/32 | 257/698 |
| 2016/0380585 A1* | 12/2016 | Gingrich, III | H02S 40/34 | 174/520 |
| 2017/0063298 A1* | 3/2017 | Lv | H02S 40/34 | |
| 2017/0063299 A1* | 3/2017 | Zhong | H02G 3/14 | |
| 2017/0133981 A1* | 5/2017 | Li | H02S 40/34 | |

* cited by examiner

PHOTOVOLTAIC JUNCTION BOX AND DIODE

CROSS-REFERENCE TO RELATED APPLICATION

This application claims the benefit of the filing date under 35 U.S.C. § 119(a)-(d) of Chinese Patent Application No. 201521011422.5, filed on Dec. 8, 2015.

FIELD OF THE INVENTION

The present invention relates to a photovoltaic junction box, and more particularly, to a photovoltaic junction box mounted on a solar panel.

BACKGROUND

A solar panel, as is known in the art, is a device for collecting solar energy and converting solar energy into electrical energy. FIG. 1 shows a photovoltaic junction box known in the prior art used on a solar panel. As shown in FIG. 1, the known photovoltaic junction box has a housing 100', four contacts 200' provided in the housing 100', and three diodes 300'. Each diode 300' is mounted on two adjacent contacts 200'.

As shown in FIG. 1, each diode 300' has a pair of separated anode pins 310', 310' and a cathode pin 320'. The pair of separated anode pins 310', 310' of each diode 300' are soldered on one of the two adjacent contacts 200', and the cathode pin 320' of each diode 300' is soldered on the other of the two adjacent contacts 200'. Each of the anode pins 310' has a soldering end portion 311' adapted to be soldered on the contact 200'.

The area of the soldering surfaces of the soldering end portions 311', 311' is relatively small, thereby forming a weak soldering holding force between the anode pins 310', 310' of the diode 300' and the contact 200'. During the actual use, the anode pins 310', 310' of the diode 300' are also prone to damage, thereby further reducing the soldering stability of the anode pins 310', 310'. Additionally, since the area of the soldering surfaces of the soldering end portions 311', 311' of the pair of anode pins 310', 310' of each diode 300' is relatively small, the current-carrying capacity of the pair of anode pins 310', 310' is reduced.

SUMMARY

An object of the invention, among others, is to provide a photovoltaic junction box with an increased soldering holding force between pins of a diode and a contact, improving the current-carrying capacity and soldering stability of the pins. The disclosed photovoltaic junction box has a housing, a plurality of contacts disposed in the housing, and a diode mounted on two adjacent contacts. Each diode has a pair of first pins separated from each other. Each first pin has a soldering end portion soldered on a first contact of the two adjacent contacts. A connection piece connects the soldering end portions of the pair of first pins and is soldered on the first contact.

BRIEF DESCRIPTION OF THE DRAWINGS

The invention will now be described by way of example with reference to the accompanying figures, of which.

DETAILED DESCRIPTION OF THE EMBODIMENT(S)

Figure 1:
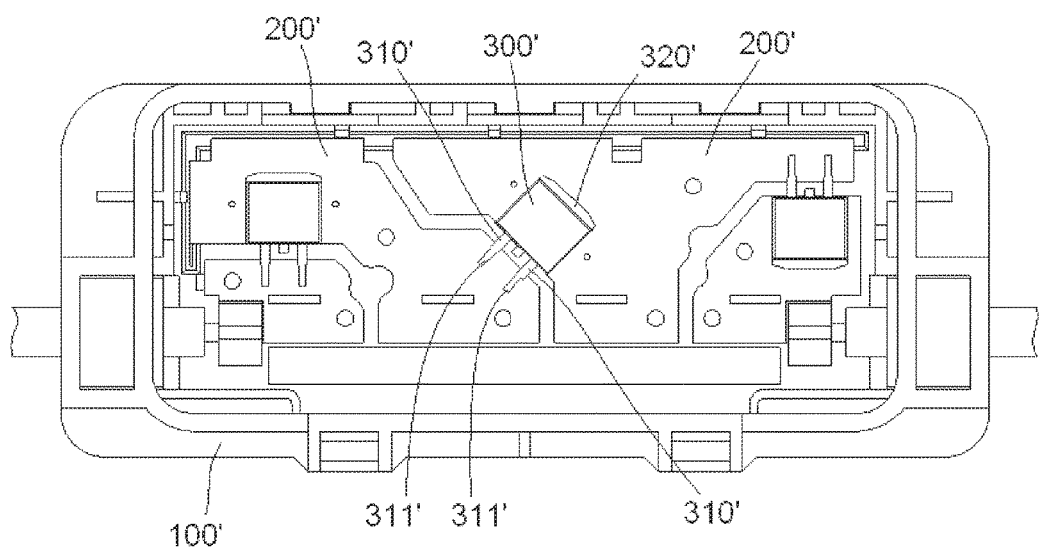
FIG. 1 is a plan view of a photovoltaic junction box known in the art.

Embodiments of the present disclosure will be described hereinafter in detail with reference to the attached drawings, wherein the like reference numerals refer to the like elements. The present disclosure may, however, be embodied in many different forms and should not be construed as being limited to the embodiments set forth herein; rather, these embodiments are provided so that the present disclosure will be thorough and complete, and will fully convey the concept of the disclosure to those skilled in the art.

Figure 2:
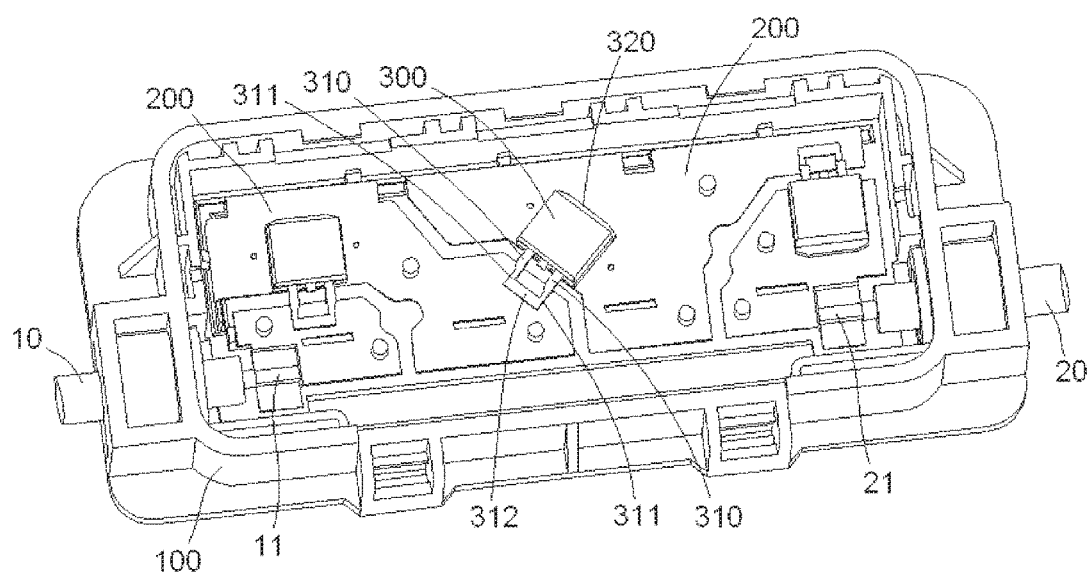
FIG. 2 is a perspective view of a photovoltaic junction box according to the invention.
Figure 3:
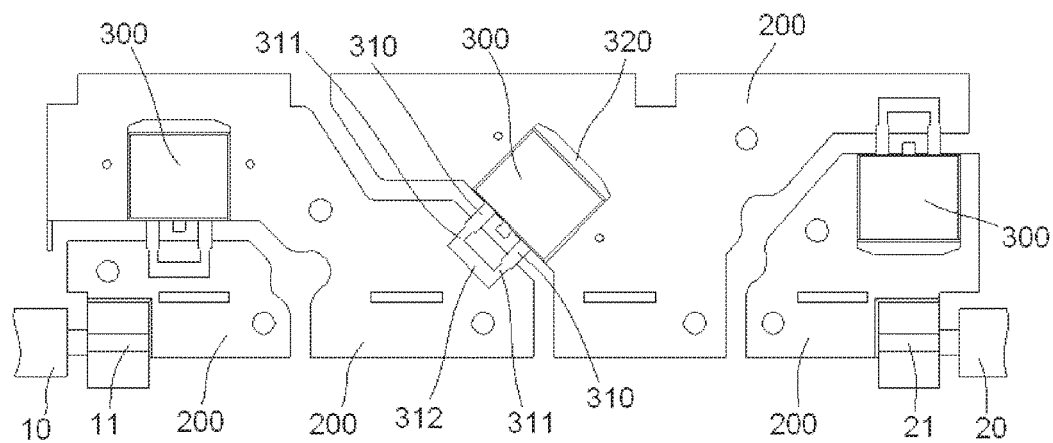
FIG. 3 is a plan view of contacts and diodes of the photovoltaic junction box of FIG. 2.

A photovoltaic junction box according to the invention, adapted to be mounted on a solar panel, is shown in FIGS. 2 and 3. The photovoltaic junction box has a housing 100, at least two contacts 200, and at least one diode 300. The contacts 200 are disposed in the housing 100. Each diode 300 is mounted on two adjacent contacts 200, 200. Each diode 300 is adapted to be mounted on a surface of the contact 200 by means of surface-mount technology.

Each diode 300, as shown in FIGS. 2 and 3, has a pair of first pins 310 separated from each other and a second pin 320 having an opposite polarity to that of the first pins 310. The pair of first pins 310 of each diode 300 are soldered on one of the two adjacent contacts 200, 200, and the second pin 320 of each diode 300 is soldered on the other of the two adjacent contacts 200, 200. Each first pin 310 has a soldering end portion 311 adapted to be soldered on the contact 200. In various embodiments, the first pin 310 acts as an anode pin or a cathode pin of the diode 300. In the shown embodiment, each of the first pins 310, 310 is formed as a substantially strip-shaped soldering line.

Each diode 300, as shown in FIGS. 2 and 3, further comprises a connection piece 312 for connecting the soldering end portions 311, 311 of the pair of first pins 310, 310. The connection piece 312 is configured to be soldered on the contact 200 along with the soldering end portions 311, 311 of the pair of first pins 310, 310 so as to increase the soldering area of the first pins 310 of the diode. In an embodiment, the pair of first pins 310, 310 of each diode 300 and the connection piece 312 between the pair of first pins 310, 310 are integrally formed from a single plate.

The connection piece 312 has a first soldering surface adapted to be soldered on the surface of one of the two adjacent contacts 200, 200. The pair of first pins 310, 310 of the diode 300 have a second soldering surface adapted to be soldered on the surface of the one of the two adjacent contacts 200, 200. An area of the first soldering surface of the diode 300 is larger than that of the second soldering surface of the diode 300. In an embodiment, the area of the first soldering surface may be 2 to 20 times the area of the second soldering surface. In another embodiment, the area of the first soldering surface may be 5 to 10 times the area of the second soldering surface.

The second pin 320 of the diode 300, as shown in FIGS. 2 and 3, has a third soldering surface adapted to be soldered on the surface of the other of the two adjacent contacts 200, 200; an area of the third soldering surface of the diode 300 is larger than that of the second soldering surface. In this way, the heat generated by a chip 330 of the diode 300 in operation, shown in FIG. 4, may be transferred rapidly to the other of the two adjacent contacts 200, 200 by the second pin 320 having a relatively large area.

Figure 4:
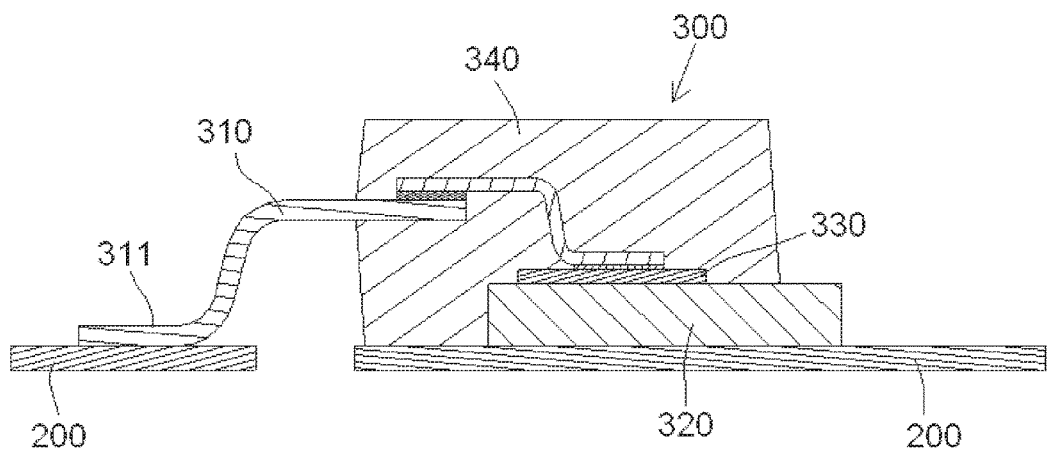
FIG. 4 is a sectional view of a diode of FIG. 3.

As shown in FIG. 4, in the diode 300, the pair of first pins 310, 310 project outwards from a side portion of a body 340 of the diode 300 and are electrically connected to a first surface of the chip 330. The body 340 is disposed around the chip 330. The second pin 320 of the diode 300 is provided at a bottom of the body 340 and is electrically connected to a second surface having the polarity opposite to that of the first surface of the chip 330. The second pin 320 is formed as a single soldering pad having a flat bottom surface adapted to be soldered on the surface of the other of the two adjacent contacts 200, 200.

In the embodiment shown in FIGS. 2 and 3, the photovoltaic junction box comprises four contacts 200 and three diodes 300. A conductor 11 of a first wire 10 extends into the housing 100 and is soldered on the leftmost contact 200, and a conductor 21 of a second wire 20 extends into the housing 100 and is soldered on the rightmost contact 200. Each diode 300 is soldered on two adjacent contacts 200.

Advantageously, in the photovoltaic junction box according to the invention, the connection piece 312 is configured to be soldered on the contact 200 along with the soldering end portions 311, 311 of the pair of first pins 310, 310, increasing the soldering area of the first pins 310, 310, thereby increasing the soldering holding force between the first pins 310, 310 and the contact 200 and thus improving the current-carrying capacity and soldering stability of the first pins 310, 310. Additionally, because the second pin 320 has a relatively large area, heat generated by a chip 330 of the diode 300 in operation may be transferred rapidly to the other of the two adjacent contacts 200, 200, thereby improving the heat dissipation performance of the photovoltaic junction box.

What is claimed is:

1. A photovoltaic junction box, comprising:
    a housing;
    a plurality of contacts disposed in the housing; and
    a diode mounted on two adjacent contacts, each diode having a body and a pair of first pins separated from each other and projecting outward from a side portion of the body, each first pin having a soldering end portion at an end opposite the body that is soldered on a first contact of the two adjacent contacts, and a connection piece connecting the soldering end portions of the pair of first pins, the pair of first pins are only physically connected by the connection piece, the connection piece having a first soldering surface soldered directly on a surface of the first contact and the pair of first pins together having a second soldering surface soldered directly on the surface of the first contact.

2. The photovoltaic junction box of claim 1, wherein each diode is mounted on a surface of each of the two adjacent contacts by surface-mount technology.

3. The photovoltaic junction box of claim 1, wherein each diode has a second pin having an opposite polarity to the pair of first pins.

4. The photovoltaic junction box of claim 3, wherein the second pin is soldered on a second contact of the two adjacent contacts.

5. The photovoltaic junction box of claim 4, wherein an area of the first soldering surface is larger than an area of the second soldering surface.

6. The photovoltaic junction box of claim 5, wherein the area of the first soldering surface is 2 to 20 times the area of the second soldering surface.

7. The photovoltaic junction box of claim 5, wherein the area of the first soldering surface is 5 to 10 times the area of the second soldering surface.

8. The photovoltaic junction box of claim 5, wherein the second pin has a third soldering surface soldered on a surface of the second contact.

9. The photovoltaic junction box of claim 8, wherein an area of the third soldering surface is larger than an area of the second soldering surface.

10. The photovoltaic junction box of claim 3, wherein the pair of first pins are electrically connected to a first surface of a chip of the diode.

11. The photovoltaic junction box of claim 10, wherein the second pin is disposed at a bottom of the body and is electrically connected to a second surface of the chip having a polarity opposite to the first surface.

12. The photovoltaic junction box of claim 11, wherein the second pin is a single soldering pad having a flat bottom surface soldered on a surface of a second contact of the two adjacent contacts.

13. The photovoltaic junction box of claim 12, wherein each of the first pins is formed as a substantially strip-shaped soldering line.

14. The photovoltaic junction box of claim 1, wherein the pair of first pins and the connection piece are integrally formed from a single plate.

15. The photovoltaic junction box of claim 1, wherein the first pin is an anode pin of the diode.

16. The photovoltaic junction box of claim 1, wherein the first pin is a cathode pin of the diode.

17. The photovoltaic junction box of claim 1, wherein the connection piece is entirely soldered on the first contact.

18. The photovoltaic junction box of claim 1, wherein the plurality of contacts are spaced apart from one another in the housing and the two adjacent contacts are only connected by the diode.

* * * * *